(12) United States Patent
Zheng et al.

(10) Patent No.: US 11,723,164 B2
(45) Date of Patent: Aug. 8, 2023

(54) CONVENIENT POWER SUPPLY BOX FOR QUICK PARAMETER ADJUSTMENT

(71) Applicant: Zhuhai Shengchang Electronics Co., Ltd., Zhuhai (CN)

(72) Inventors: Dehua Zheng, Zhuhai (CN); Chao Hou, Zhuhai (CN)

(73) Assignee: Zhuhai Shengchang Electronics Co., Ltd., Zhuhai (CN)

( * ) Notice: Subject to any disclaimer, the term of this patent is extended or adjusted under 35 U.S.C. 154(b) by 0 days.

(21) Appl. No.: 17/382,368

(22) Filed: Jul. 22, 2021

(65) Prior Publication Data

US 2022/0272854 A1     Aug. 25, 2022

(30) Foreign Application Priority Data

Feb. 25, 2021   (CN) .......................... 202120415110.X

(51) Int. Cl.
  *H05K 5/02*     (2006.01)
  *H05K 5/06*     (2006.01)
  *H05K 5/03*     (2006.01)

(52) U.S. Cl.
  CPC ............. *H05K 5/0247* (2013.01); *H05K 5/03* (2013.01); *H05K 5/061* (2013.01)

(58) Field of Classification Search
  None
  See application file for complete search history.

(56) References Cited

U.S. PATENT DOCUMENTS

| | | | | |
|---|---|---|---|---|
| 4,270,394 | A * | 6/1981 | Ito | H03J 5/28 200/336 |
| 4,844,647 | A * | 7/1989 | Schulz | B29C 66/1142 285/381.2 |
| 4,908,598 | A * | 3/1990 | Burger | H01C 10/32 338/174 |
| 6,130,984 | A * | 10/2000 | Shen | G02B 6/266 385/47 |
| 6,460,429 | B1 * | 10/2002 | Staker | B60K 26/021 74/513 |
| 7,517,109 | B2 * | 4/2009 | Kim | F21L 4/005 362/205 |
| 2005/0250377 | A1 * | 11/2005 | Gorman | H05B 39/08 439/535 |
| 2015/0204457 | A1 * | 7/2015 | Jordan | A61N 1/0553 340/539.1 |
| 2018/0366695 | A1 * | 12/2018 | Liu | H01M 50/529 |

\* cited by examiner

*Primary Examiner* — Xanthia C Cunningham
(74) *Attorney, Agent, or Firm* — Bayramoglu Law Offices, LLC

(57) ABSTRACT

A power supply box includes a box body, and a box cover is fitted on the box body. The box body is internally provided with a first inner cavity and a second inner cavity. The first inner cavity is internally provided with a potentiometer. An adjuster of the potentiometer passes through a cavity wall and is located in the second inner cavity. The first inner cavity and the second inner cavity are separated by a vertical partition plate. The second inner cavity is partitioned into a first storage cavity and a second storage cavity through a transverse partition plate. The two ends of the vertical partition plate are provided with a first open slot and a second open slot, respectively. The first inner cavity communicates with the first storage cavity through the first open slot. The first inner cavity communicates with the second storage cavity through the second open slot.

4 Claims, 2 Drawing Sheets

CONVENIENT POWER SUPPLY BOX FOR QUICK PARAMETER ADJUSTMENT

CROSS REFERENCE TO THE RELATED APPLICATIONS

This application is based upon and claims priority to Chinese Patent Application No. 202120415110.X, filed on Feb. 25, 2021, the entire contents of which are incorporated herein by reference.

TECHNICAL FIELD

The present invention relates to the technical field of power supply boxes, and in particular to a convenient power supply box for quick parameter adjustment.

BACKGROUND

The second industrial revolution has ushered mankind into the "age of electricity". Electric energy plays an important role in our lives. For example, electric energy is being widely used in various fields such as power generation, lighting, chemistry, textiles, communications and broadcasting, serving as the main driving force for the development of science and technology and the leap in people's economy.

As the conductive medium of electricity, wires are ubiquitous in our lives. To use electric energy, wires and other mediums must be connected to be energized. Power supply boxes are necessary when connecting the wires. At present, power supply boxes available on the market have the problems that the power cord cannot be stored, and the output electrical parameters are difficult to adjust, causing much inconvenience during the use of the power supply.

SUMMARY

To overcome the shortcomings of the prior art, the technical problem to be solved by the present invention is to provide a convenient power supply box for quick parameter adjustment, which is simple in structure, convenient to use, has the function of storage and can easily adjust the output electrical parameters.

The technical solution adopted by the present invention is as follows. A convenient power supply box includes a box body, and a box cover is fitted on the box body. The box body is internally provided with a first inner cavity and a second inner cavity. The first inner cavity is internally provided with a potentiometer. An adjuster of the potentiometer passes through a cavity wall and is located in the second inner cavity.

Further, the first inner cavity and the second inner cavity are separated by a vertical partition plate. The second inner cavity is partitioned into a first storage cavity and a second storage cavity through a transverse partition plate. The two ends of the vertical partition plate are provided with a first open slot and a second open slot, respectively. The first inner cavity communicates with the first storage cavity through the first open slot. The first inner cavity communicates with the second storage cavity through the second open slot. The adjuster of the potentiometer passes through the vertical partition plate and is located in the second storage cavity. Each of the side walls of the first storage cavity and the second storage cavity is provided with a wire passing hole.

Further, the box cover includes a first box cover and a second box cover. The first box cover is adapted to the first inner cavity, and is snap-fitted on the first inner cavity. The second box cover is adapted to the first storage cavity and the second storage cavity, and is snap-fitted on the first storage cavity and the second storage cavity.

Further, a sealing ring is provided on each of the first open slot and the second open slot.

Further, the adjuster is a knob type, slider type, or button type adjuster.

Further, each of one end of the first box cover and one end of the second box cover is provided with a rib.

The present invention has the following advantages. In the present invention, the box body and the box cover are fitted to form a seal, and two inner cavities, namely the first inner cavity and the second inner cavity, are disposed in the box body. The first inner cavity is provided with a potentiometer for adjusting the parameters of wires. The second inner cavity of the box body can store the wires, which is convenient to use. With this arrangement, the power supply box has a simple structure in its entirety, is convenient to use, has the function of storing wires, and can easily adjust the output electrical parameters by the potentiometer.

DETAILED DESCRIPTION OF THE EMBODIMENTS

Figure 1:
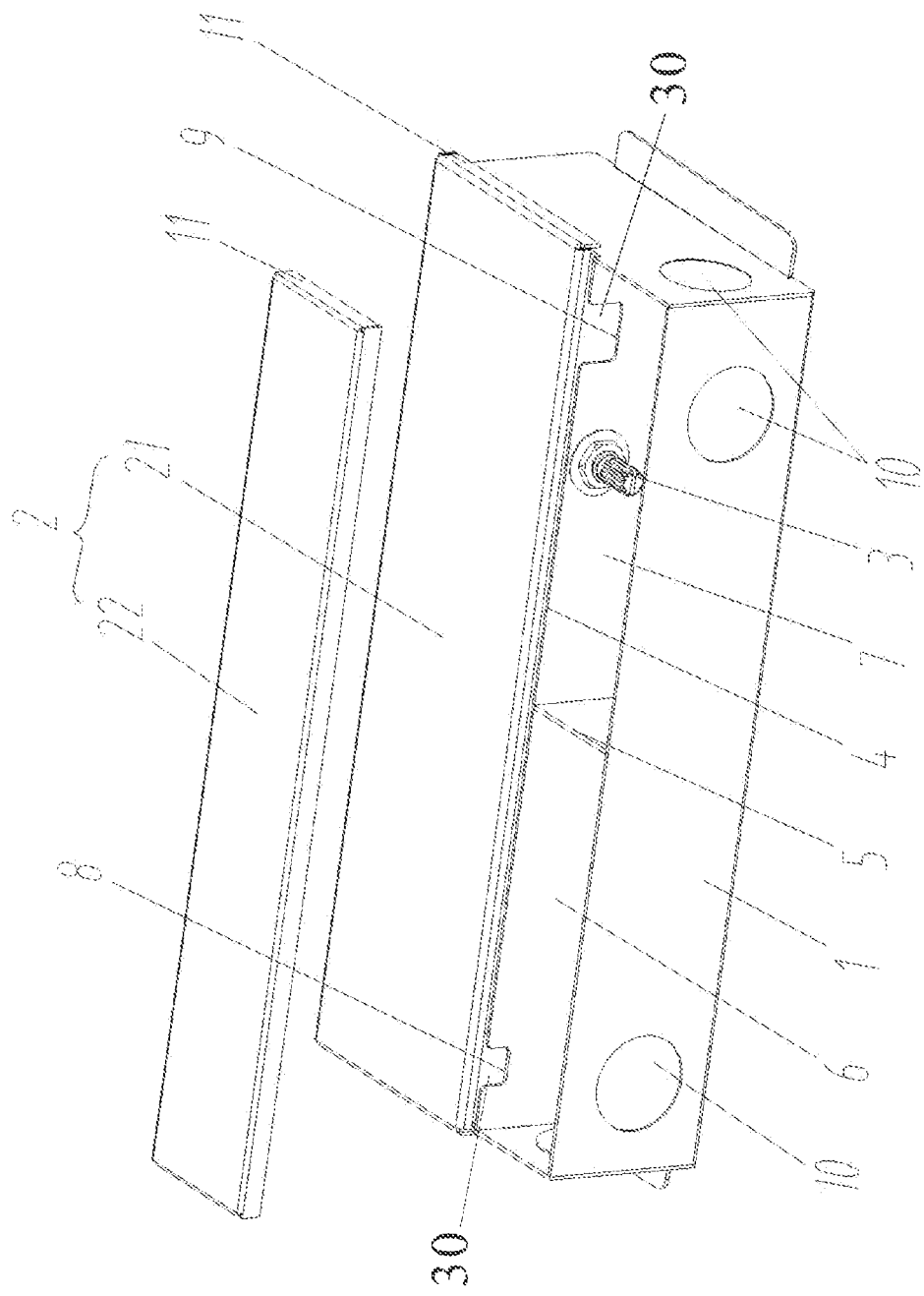
FIG. 1 is an exploded view of the present invention with the potentiometer using a knob type adjuster.
Figure 2:
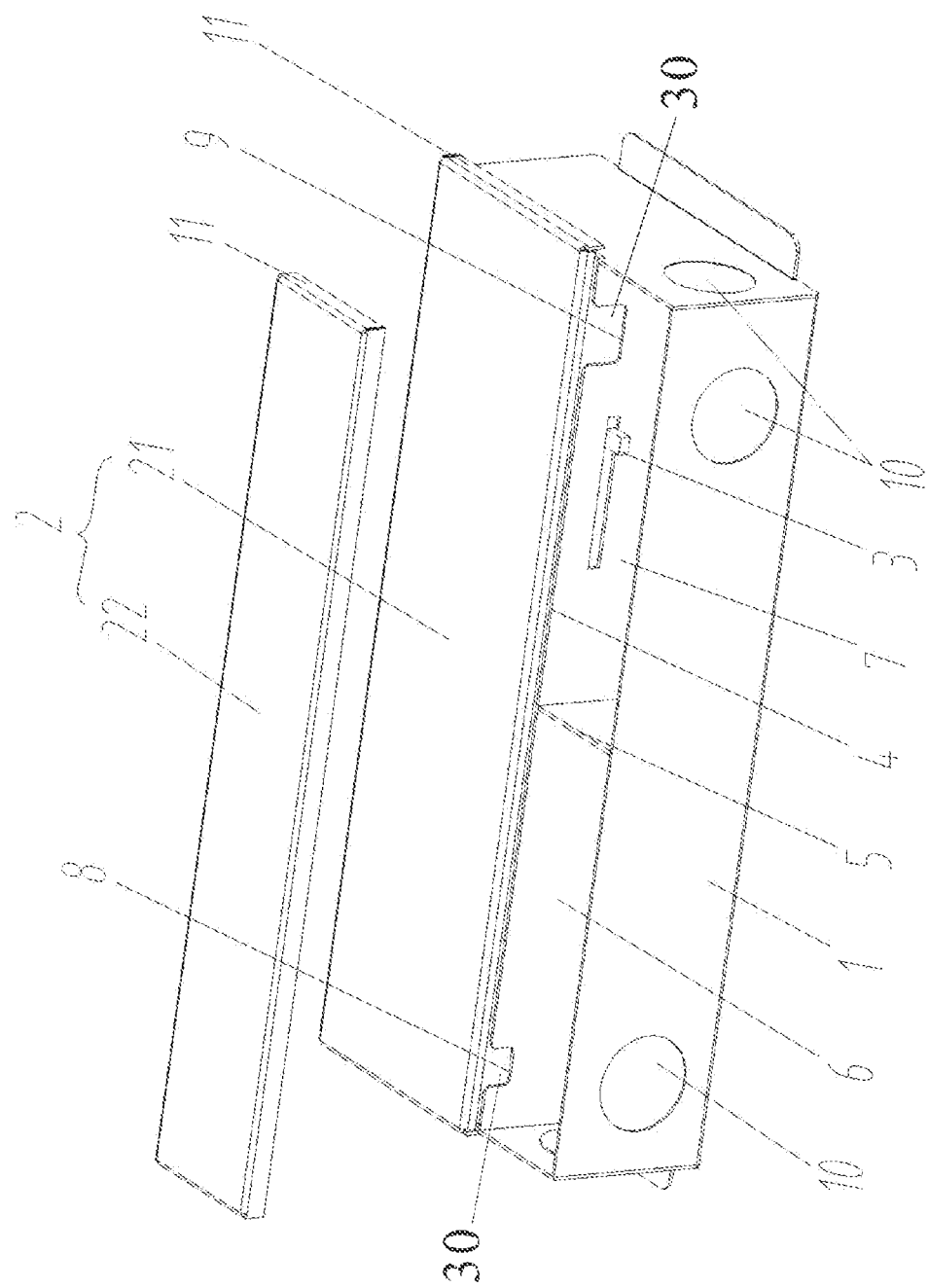
FIG. 2 is an exploded view of the present invention with the potentiometer using a slider type adjuster.

As shown in FIG. 1 and FIG. 2, in the present embodiment, the power supply box includes the box body 1, and the box cover 2 is fitted on the box body. The box body 1 is internally provided with a first inner cavity 30 and a second inner cavity. The first inner cavity 30 is internally provided with a potentiometer. The adjuster 3 of the potentiometer passes through a cavity wall and is located in the second inner cavity. The box body 1 and the box cover 2 are fitted to form a seal. The first inner cavity 30 of the box body 1 is configured to install the potentiometer. The potentiometer can adjust parameters. The second inner cavity of the box body 1 can play a role in storing wires to facilitate the storage and management of the wires. In the present invention, the box body 1 and the box cover 2 are fitted to form a seal. The potentiometer is disposed in the box body 1 to adjust parameters. The first inner cavity 30 of the box body 1 can store the wires, which is convenient to use. With this arrangement, the power supply box has a simple structure in its entirety, is convenient to use, has the function of storing wires, and can easily adjust the output electrical parameters by the potentiometer.

In the present embodiment, the first inner cavity 30 and the second inner cavity are separated by the vertical partition plate 4. The second inner cavity is partitioned into the first storage cavity 6 and the second storage cavity 7 through the transverse partition plate 5. The two ends of the vertical partition plate 4 are provided with the first open slot 8 and the second open slot 9, respectively. The first inner cavity 30 communicates with the first storage cavity 6 through the first open slot 8. The first inner cavity 30 communicates with the second storage cavity 7 through the second open slot 9. The adjuster 3 of the potentiometer passes through the vertical partition plate 4 and is located in the second storage cavity 7. Each of the side walls of the first storage cavity 6 and the second storage cavity 7 is provided with the wire passing hole 10. The inner cavity of the box body 1 is partitioned into a first inner cavity 30 and a second inner cavity by the vertical partition plate 4. The second inner cavity is partitioned into the first storage cavity 6 and the second storage cavity 7 by the transverse partition plate 5. In this way, there are three independent spaces, in which the first inner cavity 30 is configured to install the potentiometer, and the first storage cavity 6 and the second storage cavity 7 are configured to store and place wires. The installation of the potentiometer and the storage of the wires are realized by the three independent spaces. The adjuster 3 of the potentiometer can be adjusted in the second storage cavity 7, so that it is not necessary to operate from the installing cavity, that is, the first inner cavity 30. The wire passing hole 10 is a preprocessed hole, which is not punched through when leaving the factory. In use, the preprocessed hole is punched through as needed according to the orientation of the wire tube on site. When laying out the wiring, the wire passes through the wire passing hole 10 into the first storage cavity 6, and then passes through the first open slot 8 into the installing cavity and is connected to the potentiometer. The other end of the potentiometer is connected to another wire. After that, the wire passes through the second open slot 9 into the second storage cavity 7, and then passes out from the second storage cavity 7 through the wire passing hole for external connection, thereby realizing the connection between the wire and the potentiometer.

In the present embodiment, the box cover 2 includes the first box cover 21 and the second box cover 22. The first box cover 21 is adapted to the first inner cavity 30, and is snap-fitted on the first inner cavity 30. The second box cover 22 is adapted to the first storage cavity 6 and the second storage cavity 7, and is snap-fitted on the first storage cavity 6 and the second storage cavity 7. The first box cover 21 is configured to cover the first inner cavity 30. The second box cover 22 is configured to cover the first storage cavity 6 and the second storage cavity 7. In this way, the three cavities can be covered separately. In use, when the parameters need to be adjusted, only the second box cover 22 needs to be opened, and when the potentiometer needs to be maintained, only the first box cover 21 needs to be opened, thereby providing a good protection effect.

In the present invention, a sealing ring is provided on each of the first open slot 8 and the second open slot 9. The sealing ring can seal the open slot to ensure water tightness, making it waterproof and dustproof. Similarly, a sealing ring adapted to the wire can also be provided on the wire passing hole 10.

In the present embodiment, the adjuster 3 is a knob type, slider type, or button type adjuster. The adjustment mode adopted by the adjuster 3 of the potentiometer includes the knob type, the slider type or the button type (0/1 type), and other forms.

In the present embodiment, each of one end of the first box cover 21 and one end of the second box cover 22 is provided with the rib 11. With the rib 11, the first box cover 21 and the second box cover 22 are longer than the box body 1 when closed, thereby providing a point of force application during opening, which is more convenient to open the box cover 2.

The embodiments of the present invention have been described in terms of practical solutions, but are not intended to limit the meaning of the present invention. Modifications to the embodiments and combinations with other solutions will be apparent to those skilled in the art from the present description.

What is claimed is:

1. A power supply box for a quick parameter adjustment, comprising
a box body;
wherein
a box cover is fitted on the box body;
the box body is internally provided with a first inner cavity and a second inner cavity;
the second inner cavity is partitioned into a first storage cavity and a second storage cavity by a transverse partition plate;
the first storage cavity is adjacent to the first inner cavity and the second storage cavity is adjacent to the first inner cavity;
an adjuster of a potentiometer passes through a vertical partition plate separating the first inner cavity and the second inner cavity and the adjuster is located in the second inner cavity; and
two ends of the vertical partition plate are provided with a first open slot and a second open slot, respectively,
the first inner cavity communicates with the first storage cavity through the first open slot,
the first inner cavity communicates with the second storage cavity through the second open slot, and
each of side walls of the first storage cavity and the second storage cavity is provided with a wire passing hole.

2. The power supply box according to claim 1, wherein the box cover comprises a first box cover and a second box cover,
the first box cover is adapted to the first inner cavity, and the first box cover covers the first inner cavity, and
the second box cover is adapted to the first storage cavity and the second storage cavity, and the second box cover covers the first storage cavity and the second storage cavity.

3. The power supply box according to claim 2, wherein each of one end of the first box cover and one end of the second box cover is provided with a rib.

4. The power supply box according to claim 1, wherein the adjuster is a knob type adjuster, a slider type adjuster, or a button type adjuster.

* * * * *